US006670676B1

(12) United States Patent
Rahim

(10) Patent No.: US 6,670,676 B1
(45) Date of Patent: Dec. 30, 2003

(54) HOT SOCKET SOFT PULL FOR ESD DEVICES

(75) Inventor: Irfan Rahim, Milpitas, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 85 days.

(21) Appl. No.: 09/604,190

(22) Filed: Jun. 27, 2000

(51) Int. Cl.⁷ .............................................. H01L 23/62
(52) U.S. Cl. ....................... 257/355; 257/401; 257/356; 257/357
(58) Field of Search ................................ 257/302, 401, 257/355, 301, 356, 357, 358

(56) References Cited

U.S. PATENT DOCUMENTS 6,134,517 A * 10/2000 Baxter et al. .................. 703/28
6,175,952 B1 * 1/2001 Patel et al. ..................... 716/18
6,226,779 B1 * 5/2001 Baxter et al. .................. 716/16

FOREIGN PATENT DOCUMENTS

JP 406232349 A * 8/1994

OTHER PUBLICATIONS

A 4.9ns, 3.3 Volt, 512 Macrocell, CMOS PLD with Hot Socket Protection and Fast In System Programming, By Brad Vest et al., IEEE 1999 Custom Integrated Circuits Conference, pp. 187–190.

* cited by examiner

Primary Examiner—Olik Chaudhuri
Assistant Examiner—Nathan W. Ha
(74) Attorney, Agent, or Firm—Christopher P. Maiorana, P.C.

(57) ABSTRACT

An apparatus comprising a first circuit. The first circuit may be configured to limit conduction between a first and a second power supply pin in response to one or more control signals. One or more of a plurality of paths may limit the conduction in response to one or more voltages.

21 Claims, 4 Drawing Sheets

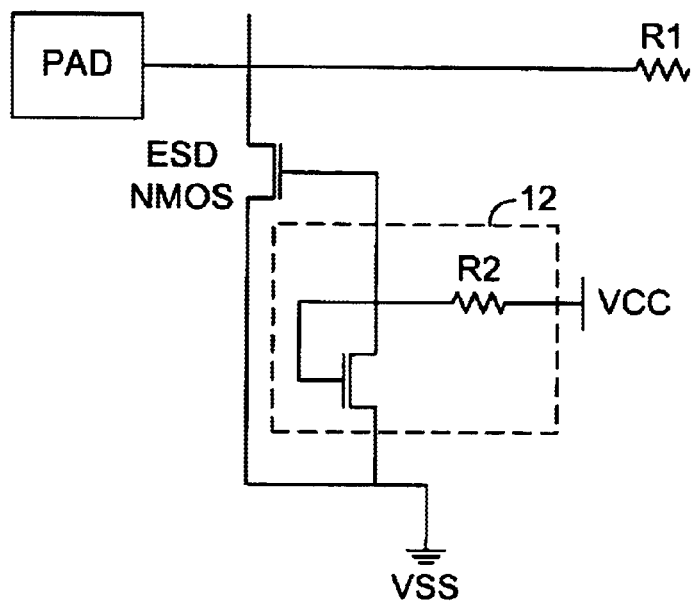
(CONVENTIONAL)
FIG. 1
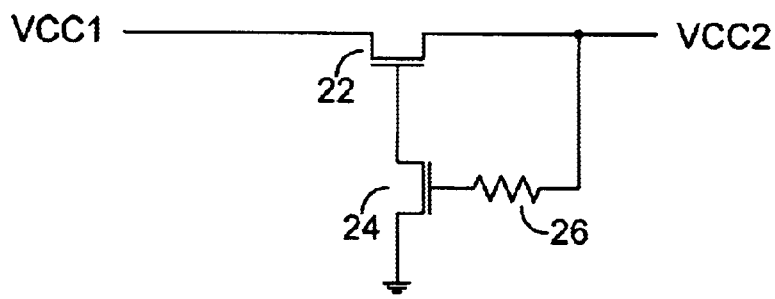
(CONVENTIONAL)
FIG. 2

HOT SOCKET SOFT PULL FOR ESD DEVICES

FIELD OF THE INVENTION

The present invention relates to a method and/or architecture for implementing electrostatic discharge (ESD) devices generally and, more particularly, to a hot socketable, soft pull circuit for ESD devices.

BACKGROUND OF THE INVENTION

Networks, telecommunication systems and other mission critical applications cannot tolerate circuit downtime. In particular, circuit boards for networks and telecommunication systems need to be capable of being replaced within operational systems. Insertion of a circuit board in an operational circuit may result in voltages being applied to signal input/output pins before voltage is applied to the power supply pins. Hot socketability refers to the removal and/or insertion of components or circuit boards within a system while the system is running. Programmable Logic Device (PLD) circuits are used in many networking and telecommunications systems. Hot socketability is a desirable function on PLD products. In addition, more dense integrated circuits are increasingly more susceptible to ESD damage as the oxide layers become thinner. With integrated circuit technology developing continuously more dense circuits, ESD performance, in general, is degrading. As a result of more dense circuitry, soft pull circuitry is required. Soft pull circuits on ESD devices need to meet the hot socketability requirement.

Referring to FIG. 1, a schematic diagram of a circuit 10 illustrating a conventional ESD device circuit is shown. The circuit 10 includes a soft pull circuit 12. The soft pull circuit 12 is powered with either a supply voltage VCC or a PAD voltage, whichever becomes active first. Since the ESD device can conduct when VCC is not active, the circuit 10 is not hot socketable. However, the conductivity of the circuit 10 can depend on the voltage of the device and the voltage level of VCC and PAD.

Referring to FIG. 2, a schematic diagram of a circuit 20 illustrating a convention power supply clamp is shown. The power supply clamp 20 is configured to control a voltage level of the voltage VCC1. The power supply clamp 20 includes a transistor 22, a transistor 24 and a resistor 26. The voltage VCC1 is coupled to an emitter of the transistor 22 and the voltage VCC2 is coupled to a collector of the transistor 22. The transistor 22 is controlled by the transistor 24. The voltage VCC2 is configured to control the transistor 24 via the resistor 26. The power supply clamp 20 is designed specifically for a particular voltage tolerance and has limited applicability.

In general, ESD device circuits (such as the circuit 10 or the circuit 20) that use a single soft pull circuit between the ESD device and ground when there are multiple voltage inputs and VCC are not hot socketable. Any of the input voltages (i.e., VCCS) to the soft pull circuit 12 may vary between 0V and a regular value. If the input voltage to the soft pull circuit 12 is not active, the soft pull circuit 12 turns off. Turning off the soft pull circuit 12 causes the ESD device circuit 10 to turn on in violation of the hot socketability requirement.

It would be desirable to (i) ensure the ESD device will be effectively grounded when any VCC (or multiple VCCS) or PAD becomes active, (ii) ensure the soft pull function turns on at the same threshold voltage as the ESD device, (iii) incorporate a simple circuit to minimize circuit board space, and (iv) provide circuit ESD protection at transient voltages above 5000V.

SUMMARY OF THE INVENTION

The present invention concerns an apparatus comprising a first circuit. The first circuit may be configured to limit conduction between a first and a second power supply pin in response to one or more control signals. One or more of a plurality of paths may limit the conduction in response to one or more voltages.

The objects, features and advantages of the present invention include providing a method and/or architecture that may provide (i) multiple soft pull circuits that effectively ground an ESD device when a voltage (e.g., relevant supply voltages VCCs or PAD) becomes active and/or (ii) a soft pull circuit that simultaneously turns on with an ESD device.

BRIEF DESCRIPTION OF THE DRAWINGS

These and other objects, features and advantages of the present invention will be apparent from the following detailed description and the appended claims and drawings in which:

FIG. 1 is a schematic diagram illustrating a conventional ESD device with a soft pull circuit;

FIG. 2 is a schematic diagram illustrating a conventional power supply clamp;

DETAILED DESCRIPTION OF THE PREFERRED EMBODIMENTS

Figure 3:
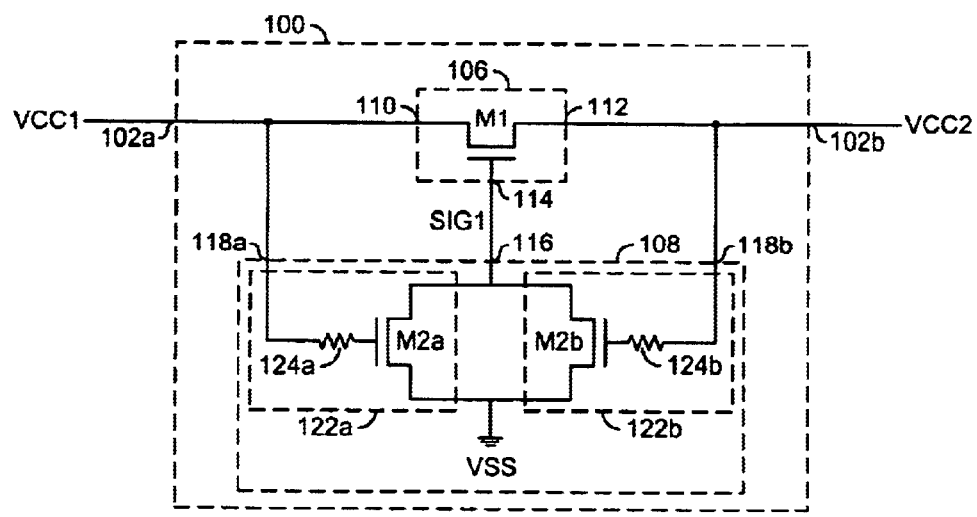
FIG. 3 is a schematic diagram illustrating a preferred embodiment of the present invention.

Referring to FIG. 3, a schematic diagram of a circuit 100 illustrating a preferred embodiment of the present invention is shown. The circuit generally comprises a power supply pin input 102a that may have an applied voltage potential (e.g., VCC1, VCC2, PAD, VSS, etc.) and a power supply pin input 102b that may have the applied voltage potential VCC1, VCC2, PAD, VSS, etc. In one implementation, the circuit 100 may be an ESD device and may be hot socketable.

The structure of the circuit 100 generally comprises a circuit 106 and a circuit 108. The circuit 106 may have an input 110 that may receive the signal VCC1, an input 112 that may receive the signal VCC2, and an input 114 that may receive a control signal (e.g., SIG1). The circuit 106 may comprise, in one implementation, a transistor M1. The transistor M1 may have a first source/drain that may be connected to the input 110, a second source/drain that may be connected to the input 112, and a gate that may be connected to the output 114. In one example, the circuit 106 may be an ESD device.

The circuit 108 may have an output 116 that may present the signal SIG1, an input 118a that may receive the signal VCC1, and an input 118b that may receive the signal VCC2. The circuit 108 may be, in one implementation, a soft pull circuit. In one implementation, the circuit 108 may comprise a circuit 122a and a circuit 122b. The circuit 122a may be implemented, in one example, as a transistor M2*a* and a resistor 124*a*. The transistor M2*a* generally comprises a first source/drain that may be connected to the output 116, a second source/drain that may receive the voltage potential VSS, and a gate. The resistor 124*a* may be connected between the gate of transistor M2*a* and the input 118*a*. The circuit 122*a* may be, in one example, a soft pull circuit. The circuit 122*b* may be implemented, in one example, as a transistor M2*b* and a resistor 124*b*. The transistor M2*b* generally comprises a first source/drain that may be connected to the output 116, a second source/drain that may receive the voltage potential VSS, and a gate. The resistor 124*b* may be connected between the gate of transistor M2*b* and the input 118*b*. In one example, the circuit 122*b* may be a soft pull circuit.

The transistors M1, M2*a*, and M2*b* may be implemented, in one example, as MOSFET transistors. However, other types of transistors may be implemented accordingly to meet the design criteria of a particular implementation. The circuit 100 is shown implemented with two soft pull circuits 124*a* and 124*b*. However, additional soft pull circuits may be implemented accordingly to meet the design criteria of a particular implementation (to be described in more detail in connection with FIG. 5). In general, each of the transistors M1, M2*a*, and M2*b* may turn on at a similar voltage threshold VT.

In general, when any of the voltage potentials VCC1, VCC2, PAD, VSS, etc. exceed a predetermined value, the circuit 108 may generate the signal SIG1. The signal SIG1 may trigger a partial shunting between the voltage potential received at the inputs 102*a* and 102*b* and the ground potential VSS.

Figure 4:
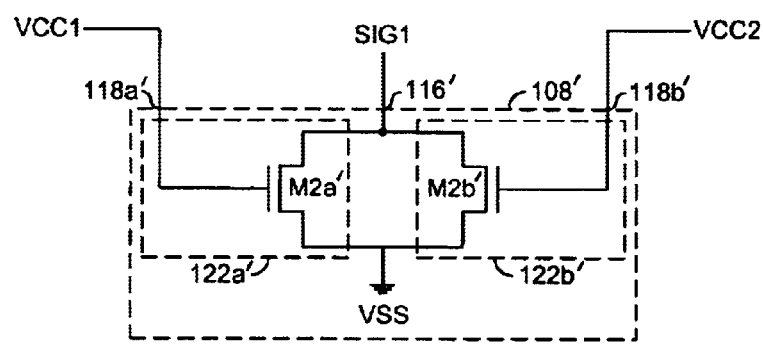
FIG. 4 is a schematic diagram illustrating an alternative embodiment of the present invention.

Referring to FIG. 4, a schematic diagram of a circuit 108' illustrating an alternative embodiment of the circuit 100 is shown. The circuit 108' may have an output 116' that may present the signal SIG1, an input 118*a*' that may receive the signal VCC1, and an input 118*b*' that may receive the signal VCC2. The circuit 108' may be, in one implementation, a soft pull circuit. In one implementation, the circuit 108' may comprise a circuit 122*a*' and a circuit 122*b*'. The circuit 122*a*' may be implemented, in one example, as a transistor M2*a*'. The transistor M2*a*' generally comprises a first source/drain that may be connected to the output 116', a second source/drain that may receive the voltage potential VSS, and a gate that may be connected to the input 118*a*'. The circuit 122*a*' may be, in one example, a soft pull circuit. The circuit 122*b*' may be implemented, in one example, as a transistor M2*b*'. The transistor M2*b*' generally comprises a first source/drain that may be connected to the output 116', a second source/drain that may receive the voltage potential VSS, and a gate that may be connected to the input 118*b*'. In one example, the circuit 122*b*' may be a soft pull circuit. The transistors M2*a*' and M2*b*' may be implemented, in one example, as MOSFET transistors. However, other types of transistors may be implemented accordingly to meet the design criteria of a particular implementation. In general, when any of the voltage potentials VCC1, VCC2, PAD, VSS, etc. exceed a predetermined value, the circuit 108' may generate the signal SIG1.

Figure 5:
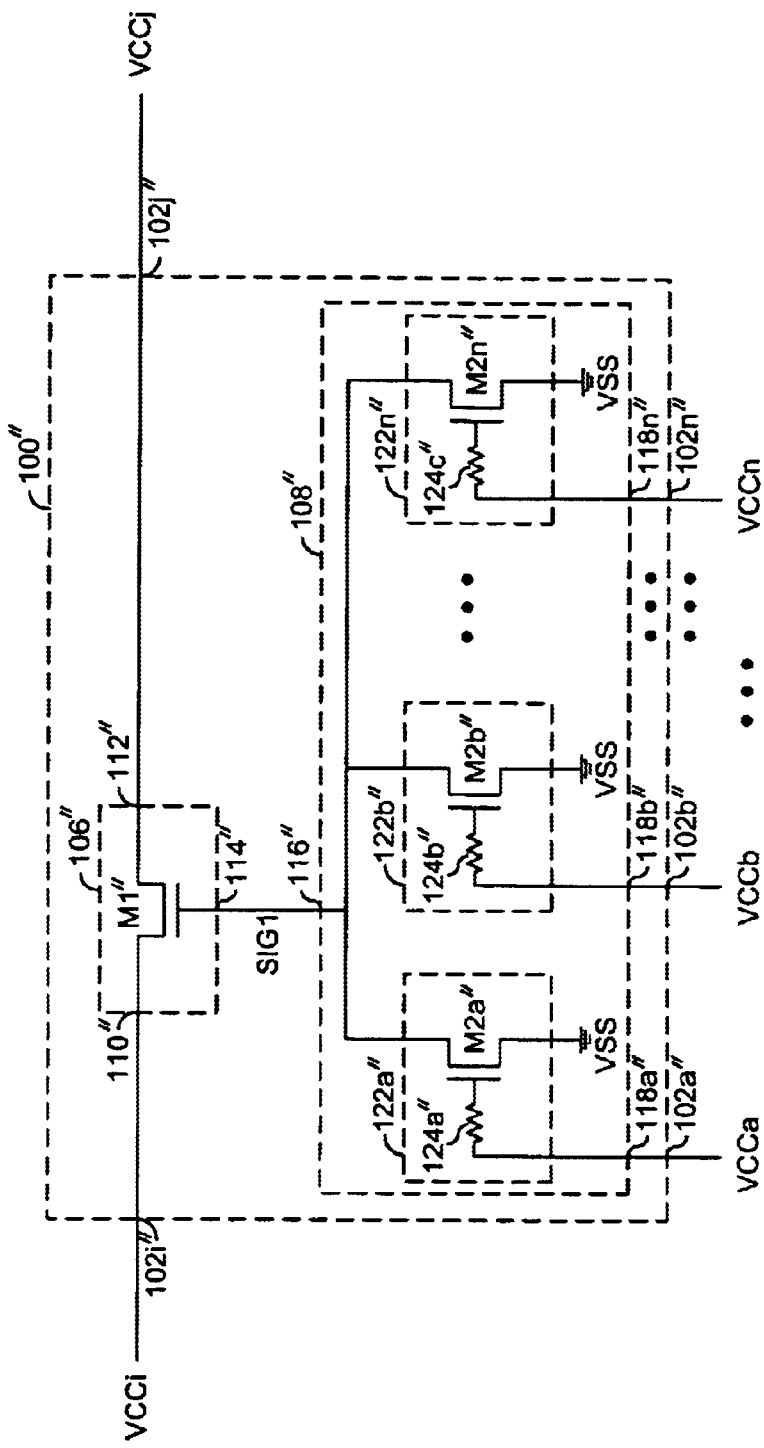
FIG. 5 is a schematic diagram illustrating another alternative embodiment of the present invention.

Referring to FIG. 5, a schematic diagram of a circuit 100" illustrating an alterative embodiment of the invention is shown. The circuit 100" may comprise a circuit 106" and a circuit 108". The circuit 100" may have a number of power supply pin inputs 102*a*"–102*n*' that may have applied voltage potentials VCC*a*–VCC*n*, PAD, VSS, etc. The circuit 100" may be hot socketable.

The circuit 106" may comprise a transistor M1" with a first source/drain that may be connected to an input 110", a second source/drain that may be connected to an input 112", and a gate that may be connected to an output 114". The output 114" may receive the signal SIG1. The input 110" may be connected to the input 102*i*'. The input 112" may be connected to the input 102*j*'. In one example, the circuit 106" may be an ESD device.

The circuit 108" may comprise a number of circuits 122*a*'–122*n*'. The circuit 108" may have an output 116" that may present the signal SIG1 and a number of inputs 118*a*"–118*n*" that may be connected to the inputs 102*a*"–102*n*". The circuits 122*a*"–122*n*" may comprise transistors M2*a*"–M2*n*" and resistors 124*a*"–124*n*". The transistors M2*a*"–M2*n*" generally comprise a first source/drain that may be connected to the output 116", a second source/drain that may receive the voltage potential VSS, and a gate. The resistors 124*a*"–124*n*" may be connected between the gates of transistors M2*a*"–M2*n*" and the inputs 118*a*"–118*n*". The circuits 122*a*"–122*n*" may each be implemented, in one example, as soft pull circuits. The transistors M1" and M2*a*"–M2*n*" may be implemented as MOSFET transistors. However, other types of transistors may be implemented accordingly to meet the design criteria of a particular implementation. In general, the transistors M1", M2*a*"–M2*n*" may turn on at a similar voltage threshold VT.

In general, when any of the voltage potentials VCC*a*–VCC*n*, PAD, VSS, etc. exceed a predetermined value, the circuit 108" may present the signal SIG1. The signal SIG1 may initiate partial shunting of the applied voltage potential to circuit ground potential.

The present invention may provide a plurality of soft pull circuits 122*a*"–122*n*". The soft pull circuits 122*a*"–122*n*" may be effective in grounding the circuit 106" (which may be an ESD device), with any applied voltage VCC*a*–VCC*n*, PAD, VSS, etc. The soft pull circuits 122*a*"–122*n*' may turn on at same applied voltage as the ESD device 106".

Figure 6:
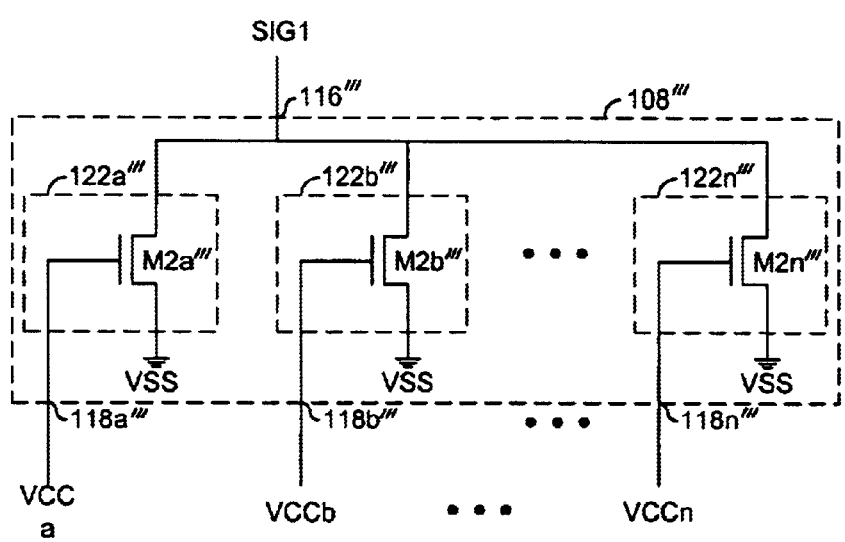
FIG. 6 is a schematic diagram illustrating another alternative embodiment of the present invention.

Referring to FIG. 6, a schematic diagram of a circuit 108'" illustrating an alternative embodiment of the circuit 100" is shown. The circuit 108'" may comprise a number of circuits 122*a*'"–122*n*'". The circuit 108'" may have an output 116'" that may present the signal SIG1 and a number of inputs 118*a*'"–118*n*'" that may be connected to the inputs 102*a*"–102*n*'. The circuits 122*a*'"–122*n*'" may comprise transistors M2*a*'"–M2*n*'". The transistors M2*a*'"–M2*n*'" generally comprise a first source/drain that may be connected to the output 116'", a second source/drain that may receive the voltage potential VSS, and a gate that may be connected to the inputs 118*a*'"–118*n*'". The circuits 122*a*'"–122*n*'" may each be implemented, in one example, as soft pull circuits. In general, when any of the voltage potentials VCC*a*–VCC*n*, PAD, VSS, etc. exceed a predetermined value, the circuit 108'" may present the signal SIG1. The transistors M2*a*'"–M2*n*'" may be implemented as MOSFET transistors. However, other types of transistors may be implemented accordingly to meet the design criteria of a particular implementation. In general, the transistors M2*a*'"–M2*n*'" may turn on at a similar voltage threshold VT.

The transistor structure of the circuits 108–108'" may provide, in particular applications, increased performance compared with only resistor structure use in similar circuits. In one example, the resistor structure may provide circuit ESD protection up to 3300v, while transistor structure may provide circuit ESD protection up to 6000v.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit (i) coupled between a first pin and a second pin and (ii) configured to limit conduction between said first and second pins in response to one or more control signals; and
   a second circuit configured to generate said one or more control signals in response to (i) a first voltage potential at said first pin, (ii) a second voltage potential at said second pin and (iii) a circuit ground potential.

2. The apparatus according to claim 1, wherein said second circuit is further configured to generate said one or more control signals in response to one or more third voltage potentials.

3. The apparatus according to claim 1, wherein said first and second circuits are configured to shunt said first and second voltage potentials applied to said first and second pins to said circuit ground potential.

4. The apparatus according to claim 2, wherein said second circuit is configured to present said circuit ground potential as said one or more control signals in response to any of said first, second and third voltage potentials exceeding a predetermined level.

5. The apparatus according to claim 1, wherein said first circuit comprises an electrostatic discharge (ESD) device.

6. The apparatus according to claim 1, wherein said first circuit comprises an electrostatic discharge (ESD) transistor with a first source/drain connected to said first pin, a second source/drain connected to said second pin, and a gate configured to receive said one or more control signals.

7. The apparatus according to claim 2, wherein said second circuit comprises a plurality of soft pull circuits, each soft pull circuit configured to present said circuit ground potential as one of said one or more control signals in response to a respective one of said first, second and third voltage potentials exceeding a predetermined level.

8. The apparatus according to claim 1, wherein said second circuit comprises a plurality of transistors each having a first source/drain connected to receive said circuit ground potential and a second source/drain configured to present said one or more control signals, wherein (i) a gate of a first transistor of said plurality of transistors is coupled to said first pin and (ii) a gate of a second transistor of said plurality of transistors is coupled to said second pin.

9. The apparatus according to claim 8, wherein said second circuit further comprises (i) a first resistor connected between said gate of said first transistor and said first pin and (ii) a second resistor connected between said gate of said second transistor and said second pin.

10. The apparatus according to claim 6, wherein said second circuit comprises a plurality of transistors configured to present said circuit ground potential as said one or more control signals in response to either of said first and second voltage potentials exceeding a predetermined level.

11. The apparatus according to claim 2, wherein each of said one or more third voltage potentials are coupled via a resistor to a gate of a transistor configured to receive said circuit ground potential and present one of said one or more control signals.

12. The apparatus according to claim 1, wherein said first and second pins comprise first and second power supply pins.

13. The apparatus according to claim 9, wherein said first transistor and said second transistor comprise metal oxide semiconductor field effect (MOSFET) transistors.

14. The apparatus according to claim 10, wherein each of said plurality of transistors comprises a metal oxide semiconductor field effect (MOSFET) transistors.

15. The apparatus according to claim 6, wherein said ESD transistor comprises at least one metal oxide semiconductor field effect (MOSFET) transistor.

16. The apparatus according to claim 1, wherein:
    said first circuit comprises an electrostatic discharge (ESD) transistor with (i) a first source/drain connected to a first power supply pin, (ii) a second source/drain connected to an input pin, and (iii) a gate configured to receive said one or more control signals; and
    said second circuit comprises a plurality of transistors each with a first source/drain coupled to said circuit ground potential, a second source/drain configured to present said one or more control signals, wherein a gate of a first transistor is coupled to said power supply pin and a gate of a second transistor is coupled to said input pin.

17. The apparatus according to claim 16, wherein said second circuit further comprises a first resistor coupled between said gate of said first transistor and said power supply pin and a second resistor coupled between said gate of said second transistor and said input pin.

18. The apparatus according to claim 8, wherein each of said plurality of transistors is configured to have a similar threshold voltage.

19. The apparatus according to claim 16, wherein said ESD transistor and said plurality of transistors are each configured to have a similar threshold voltage.

20. An apparatus comprising:
    means for presenting one or more control signals in response to any of a plurality of voltage potentials applied at a plurality of pins exceeding a predetermined level and (i) a circuit ground potential; and
    means for limiting conduction between a first pin and a second pin of said plurality of pins in response to said one or more control signals.

21. A method for providing a hot socketable soft pull for ESD devices comprising the steps of:
    presenting one or more control signals in response to (i) any of a plurality of voltage potentials applied at a plurality of power supply pins exceeding a predetermined level; and
    limiting conduction between a first pin and a second pin of said plurality of power supply pins in response to said one or more control signals.

* * * * *